United States Patent [19]
Koguchi et al.

[11] Patent Number: 5,717,207
[45] Date of Patent: Feb. 10, 1998

[54] TRANSMISSION ELECTRON MICROSCOPE WITH CAMERA SYSTEM

[75] Inventors: Masanari Koguchi, Higashi-kurume; Hiroshi Kakibayashi, Nagareyama; Hiroyuki Tanaka; Shigeto Isakozawa, both of Hitachinaka; Keiichi Kanehori, Sayama; Tatsuo Makishima, Tokyo; Kazutaka Tsuji, Hachioji, all of Japan

[73] Assignee: Hitachi, Ltd., Tokyo, Japan

[21] Appl. No.: 685,105

[22] Filed: Jul. 22, 1996

[30] Foreign Application Priority Data

Aug. 3, 1995 [JP] Japan ................. 7-198341

[51] Int. Cl.$^6$ .................. H01J 37/26; H01J 37/22
[52] U.S. Cl. .................. 250/311; 250/397
[58] Field of Search ................. 250/311, 397

[56] References Cited

U.S. PATENT DOCUMENTS

| | | | |
|---|---|---|---|
| 3,051,860 | 8/1962 | Haine et al. | 250/311 |
| 3,370,168 | 2/1968 | Komoda et al. | 250/311 |
| 4,211,924 | 7/1980 | Müller | 259/311 |
| 4,514,629 | 4/1985 | Smith et al. | 250/311 |
| 5,300,776 | 4/1994 | Krivanek | 250/307 |
| 5,349,382 | 9/1994 | Tamura | 348/345 |
| 5,401,964 | 3/1995 | Mancuso | 250/307 |

FOREIGN PATENT DOCUMENTS

425243A2  5/1991  European Pat. Off. .

OTHER PUBLICATIONS

G.Y. Fan et al, "High–Sensitivity Lens–Coupled Slow–Scan CCD Camera for Transmission Electron Microscopy", Ultramicroscopy, vol. 52, 1993, pp. 21–28.

Patent Abstracts of Japan, JP6139991, vol. 18, No. 434, May 20, 1994, Hiroyuki et al, Transmittaion Electron Microscope.

Patent Abstracts of Japan, JP6249799, vol. 18, No. 638, Sep. 9, 1994, Takayoshi et al, Quick and Precision Measuring Apparatus for Electron–Beam Diffraction Intensity.

Buggy et al, "Optimization of Post–Specimen Lenses for Use in STEM", Electron Microscopy and Analysis Proceedings, No. 61, Sep. 1981, pp. 197–200.

*Primary Examiner*—Jack I. Berman
*Attorney, Agent, or Firm*—Fay, Sharpe, Beall, Fagan, Minnich & McKee

[57] ABSTRACT

A transmission electron microscope has a camera system that is linked to the optical lens system of the electron microscope by linking the number of electron beam scanning lines of the camera system with the zoom function of the optical lens system. Thus, the number of scanning lines increases as the magnification of the transferred image decreases. Further, the specimen under observation is photographed with a constant number of pixels at all times regardless of the magnification of the transferred image by the optical lens system, thus preventing a reduction in the amount of specimen information.

30 Claims, 14 Drawing Sheets

TRANSMISSION ELECTRON MICROSCOPE WITH CAMERA SYSTEM

BACKGROUND OF THE INVENTION

1. Field of the Invention

The present invention relates generally to camera systems used in transmission electron microscopes and, more particularly, to image sensors employed in such camera systems.

2. Description of the Related Art

A camera system used in conventional electron microscopes, as disclosed in *Ultramicroscopy*, Vol. 52, pages 21–29 (1993), transforms an electron beam image into an optical image using a scintillator, and transfers the optical image onto a charge-coupled device (CCD) using an optical lens system.

This optical lens system is constituted by a combination of two lenses, and can perform zooming by freely changing the distance between the lenses and the distance between the objective lens and the CCD. With the zoom function, the camera system can transfer an image from the scintillator onto a light sensing area of the CCD with a magnification ranging from 1:1 to 3:1 reduction. In other words, the conventional camera system can expand the field of vision three times (nine times in terms of area).

To expand the visual field during observation, the conventional electron microscope changes its magnification. That is, when the magnification of the electron microscope is 30,000x, the visual field is expanded three times by lowering the magnification to 10,000 times. Changing the magnification of the electron microscope, however, changes the conditions of specimen irradiation by the electron beam, which changes the observation condition. The ability to expand the field of vision by the zooming function without changing the magnification of the electron microscope is a great practical advantage in searching a visual field and grasping an overall image of the specimen.

This camera system, however, has the following two problems.

The first problem is a reduction in the amount of image information of the specimen under observation due to expansion of the visual field.

For example, when the light sensing area has a size of (a×a) and the number of pixels (b×b), the size of one pixel is (a/b)×(a/b), which is the minimum size that can be photographed. Assuming that the specimen being observed has a size of c×c on the scintillator and that the magnification of an image being transferred by an optical lens is M (M<1 in the case of reduction transfer), the specimen is recorded with (cMb/a)×(cMb/a) pixels. Hence, in the case of reduction transfer of an image, the number of pixels used to depict the specimen decreases.

In the case of the prior art apparatus discussed above, a/b=24 μm. For a 1:1 magnification transfer (M=1) and a specimen size of 240 μm (=c), cMb/a=10. That is, the specimen is depicted with 100 pixels. For a 2:1 reduction transfer, M=0.5 and cMb/a=5. The specimen in this case is depicted with 25 pixels.

The difference between a 1:1 transfer and a 2:1 reduction transfer indicates that selecting a reduction factor of 2 results in the specimen information being reduced to one-fourth. This problem may be prevented by increasing b or reducing a as M is reduced. However, the above apparatus employs a CCD, which has a fixed number of pixels and a fixed size, so that b and a cannot be changed during observation.

The second problem suffered by the above apparatus is that the image cannot be magnified; only a reduction transfer is possible. The reduction transfer is advantageous to searching for an appropriate viewing area and taking an overall picture of a specimen during observation. For general observations, however, once the viewing area is determined and the observation conditions of the electron microscope set, it is often desired to expand a particular location for detailed photographing and analysis. To suit this need, the image on the scintillator is magnified onto the light sensing area of an image sensor by limiting the viewing field. Hence, a lens system with M>1 is required, but cannot be realized with the above apparatus.

SUMMARY OF THE INVENTION

The present invention addresses the first problem of the prior art with an optical lens system having three or more lenses used in combination to vary the focal distance of the camera system. The control of the electron beam scan for reading the image sensor signal is linearly associated with the focal distance (magnification) adjustment in a preferred optical lens system according to the invention, although a more complex relationship that accounts for various optical parameters and abberations may be desired in view of a need for more precise resolution.

To permit the number of scanning lines to be changed freely, an image pickup tube is preferably used as the image sensor. The conventional image pickup tube has 525 lines corresponding to ordinary television monitors (U.S.). The period of the signal input to the deflection coils that control the scanning electron beam may be reduced to increase the number of scan lines to several thousand, as needed for high definition television.

Thus, the value of b (number of scanning lines) is increased as the M (magnification of image being transferred) is reduced by the focal distance adjustment in the optical lens system. For example, current image pickup tube technology can easily increase the number of scanning lines to 1000 in 2:1 reduction transfer, and to 1500 in 3:1 reduction transfer.

Further, if the number of scanning lines is set to 4000 in 2:1 reduction transfer, a significant increase in the amount of information is realized. Such control of the number of scanning lines cannot be achieved with a CCD, which has a fixed number of pixels. In other words, the prior art cannot perform such control.

Preferably, the image pickup tube has a high sensitivity and high resolution. In this respect, the image pickup tube may be a photoconductive target of an amorphous selenium film, and may use a scintillator of metal oxyorthosilicate crystals, which is compatible with the image pickup tube in terms of photosensitivity, and which has a small electron beam diffusion and a large optical output.

The second problem of the prior art is resolved in accordance with the focal distance on the scintillator side. If $f_1$ denotes the variable focal distance of the lens on the scintillator side, and if $f_2$ denotes the variable focal distance on the image side, selecting $f_1 < f_2$ allows a magnifying transfer, and $f_1 > f_2$ allows a reduction transfer. This solution is applicable whether the image sensor is a CCD or a camera tube.

By increasing the number of scanning lines according to the image reduction factor, the visual field can be expanded or reduced as desired, without reducing the amount of specimen information and without having to change the observation conditions of the electron microscope.

DETAILED DESCRIPTION OF THE PREFERRED EMBODIMENTS

Figure 1:
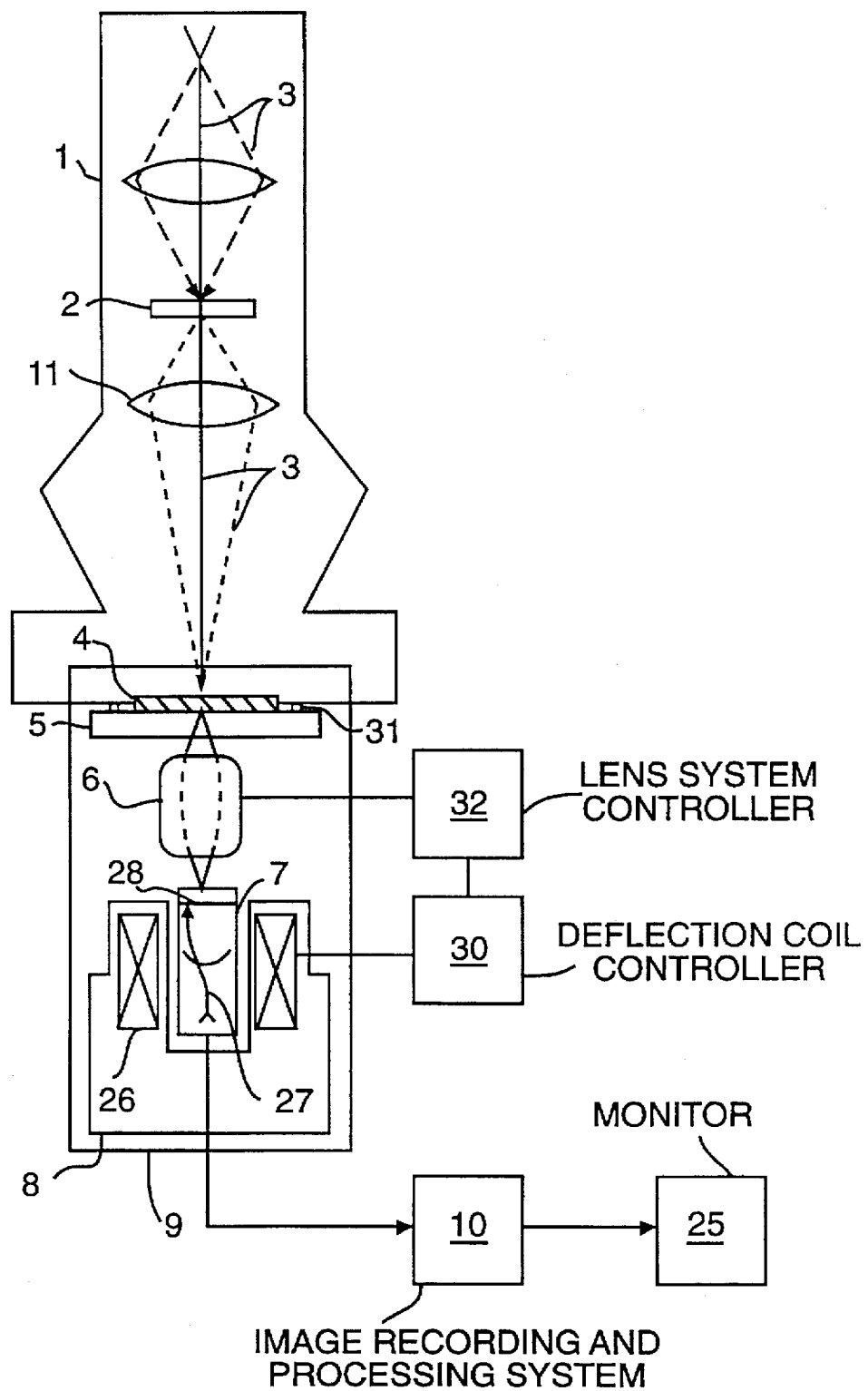
FIG. 1 illustrates an overall configuration of an electron microscope having a camera system.

FIG. 1 shows an overall configuration of an electron beam image photographing system using an electron microscope as one embodiment of the present invention. An electron beam 3 radiated against a specimen 2 installed inside a transmission electron microscope 1 is projected through an electron lens 11 onto a scintillatot 4, which converts the electron beam image into an optical image. The optical image produced by the scintillatot 4 leaves the transmission electron microscope 1 through a glass window 5 and enters an optical lens system 6, which transfers the optical image onto a photoconductive target 28 of an image sensor 7.

In this embodiment, the image sensor 7 is an image pickup tube. The scintillatot 4 preferably has a size of 900 mm$^2$ (i.e., 30 mm×30 mm), with a thickness of 10 μm–100 μm, depending on the acceleration energy.

Incident light striking the photoconductive target 28 of the image pickup tube accumulates electrical charges in the photoconductive target 28. An electron beam 27 is scanned over the target two-dimensionally to read the level of electrical charge and thereby measure the intensity of the image. The two-dimensional scanning of the electron beam 27 is controlled by a deflection coil 26 in a camera body 8. Both the lens system and the camera body 8 may be 150 mm in diameter, and 200 mm long.

The image magnification of the optical lens system 6 is adjusted by appropriate setting of the lens position and by zooming. These controls can be performed electrically from a lens system controller 32, which is linked with a deflection coil controller 30 to control the scan interval according to the image reduction factor of the optical lens system 6. For example, the number of scanning lines is set to 1000 for a 2:1 reduction transfer, and to 1500 for a 3:1 reduction transfer, by the deflection coil controller 30 in the process of scanning the electron beam 27. By permitting the number of scanning lines to be freely set (for example, to 4000 for the 2:1 reduction transfer), a significant increase in the amount of information is possible. The image signal read out in this way is sent to an image recording and processing system 10, and then displayed on a monitor 25.

Figure 2:
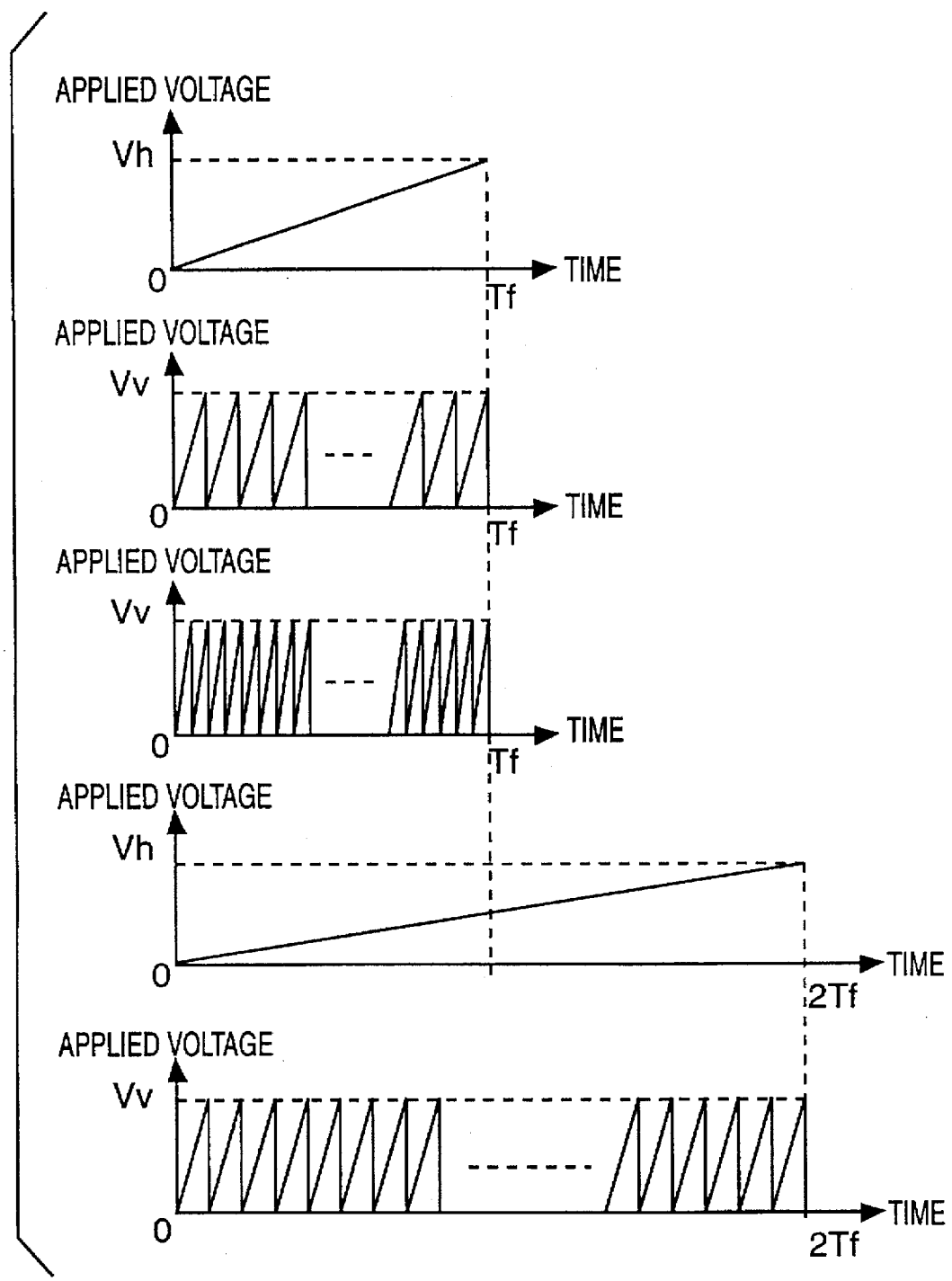
FIG. 2 shows waveform input to the deflection coil for controlling the electron beam.

Input waveforms for the deflection coil controller 30 will be described next with reference to FIG. 2. The top waveform of FIG. 2 illustrates scanning in the horizontal direction, wherein a voltage Vh required for a deflection through one frame height is applied for the time duration Tf (normally 1/60 second) required for one frame scanning. In the vertical scanning shown in the second waveform of FIG. 2, a voltage Vv required for a deflection through one frame width is repetitively applied the number of times that corresponds to the number of scanning lines, for the time duration Tf. To change the number of scanning lines, the vertical deflection voltage change is applied twice as many times for the time duration Tf, as shown in the third waveform of FIG. 2, while maintaining the horizontal scanning of the first (top) waveform of FIG. 2. This increases the number of scanning lines, for example, from the normal 525 to 1050.

Because reducing the time for one scanning line below that shown in the second waveform of FIG. 2 degrades the signal-to-noise ratio S/N, the time required for scanning one frame is doubled (normally 1/30 second) as shown in the fourth and fifth waveforms of FIG. 2, to make the time required for one scanning line equal to that required in the case of 525 scan lines. Similar processing can be performed for an arbitrary number of scanning lines, such as 1500, 2000, or 4000. Incidentally, while in this embodiment, the applied voltage has been shown to be positive, the absolute value itself has no special meaning, and a similar result can be produced if the applied voltage is in the range of −Vh/2 to +Vh/2.

In the present embodiment, the glass window 5 constitutes a substrate for the scintillator 4, and at the same time a partition window that isolates the scintillator, which is installed in a vacuum, from the optical lens system 6, which is installed in air. The glass window 5 is mounted to the transmission electron microscope 1 through an O-ring 31. If the optical lens system 6 and associated components installed below it, such as camera body 8, can be installed in the vacuum, the glass window 5 and O-ring 31 are not required, simplifying the configuration.

Next, the optical lens system 6 will be described in detail. Several configurations are discussed.

Figure 3:
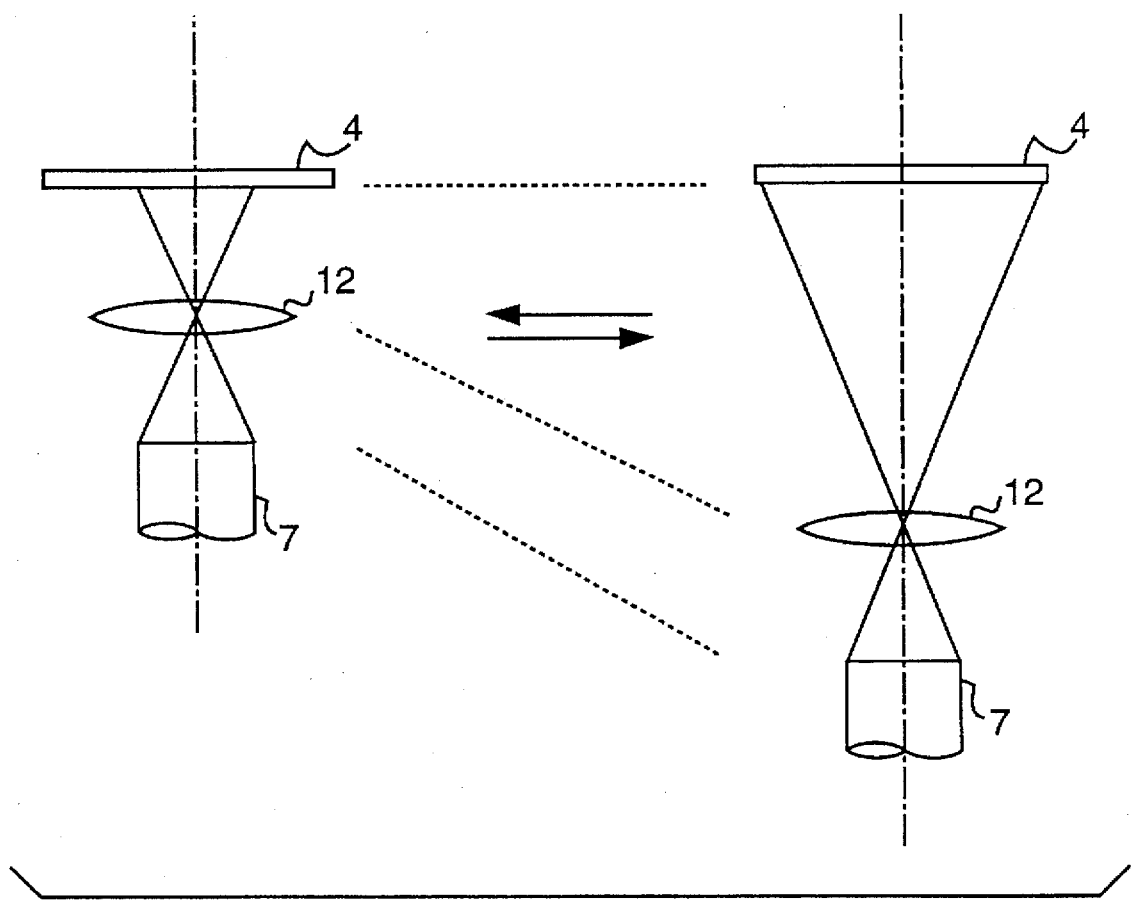
FIG. 3 illustrates a zooming function of a single-lens configuration.

An embodiment with a single-lens configuration is shown in FIG. 3. As shown in the lefthand side of FIG. 3, an image on the scintillatot 4 can be transferred onto the image sensor 7 with 1:1 magnification by a single convex lens 12. By adjusting the position of the convex lens 12 and the image sensor 7, a different reduction transfer can be obtained. The righthand side of FIG. 3 illustrates schematically a 2:1 reduction transfer, which expands the field of vision. Similarly, by moving the convex lens 12 and the image sensor 7 toward the scintillator 4, the transferred image can be magnified, limiting the field of vision.

Figure 4:
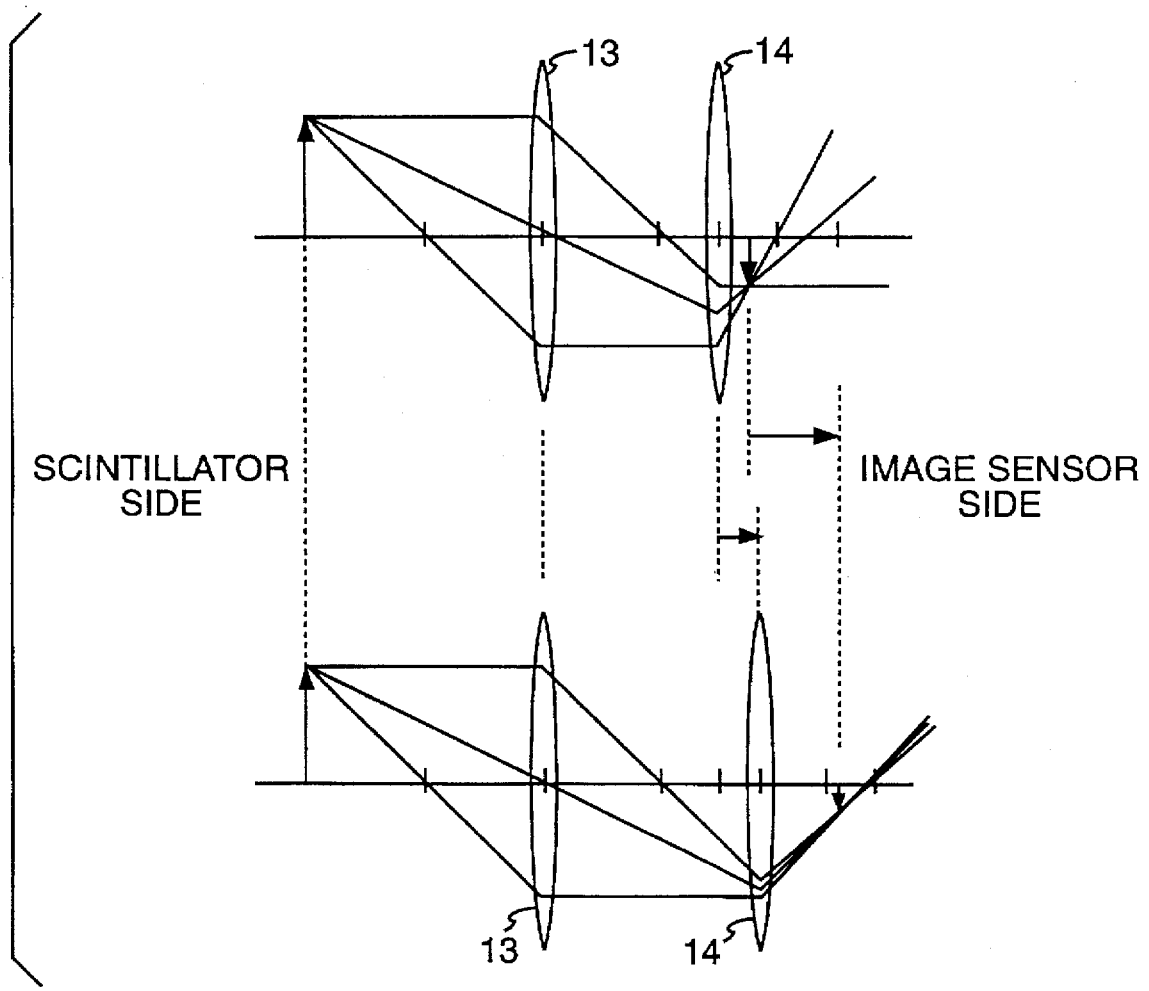
FIG. 4 illustrates the zooming function of a two-lens configuration.

FIG. 4 illustrates another embodiment, which uses two convex lenses in combination. To expand or reduce the transferred image in the single-lens configuration, the lens and the image sensor must be moved a relatively great distance, as shown in FIG. 3. In the embodiment of FIG. 4, on the other hand, the transferred image can be expanded or reduced by moving the two lenses and the image sensor through a much smaller distance.

As shown in FIG. 4, the lens system includes, for example, a first lens 13 and a second lens 14 having one-half the focal distance of the first lens 13. In the top half of the illustration, the image on the scintillator is transferred onto the image sensor with 2:1 reduction. By moving one of the lenses and the image sensor toward or away from the scintillator, the transferred image can be further reduced, as shown in the bottom half of the illustration. With this method, because the transferred image is already reduced to one-half with the lenses at the light sensing position, and because the lenses and the image sensor do not need to be moved as much as for the embodiment of FIG. 3, the apparatus according to this embodiment is advantageous in terms of reduced installation space.

Figure 5:
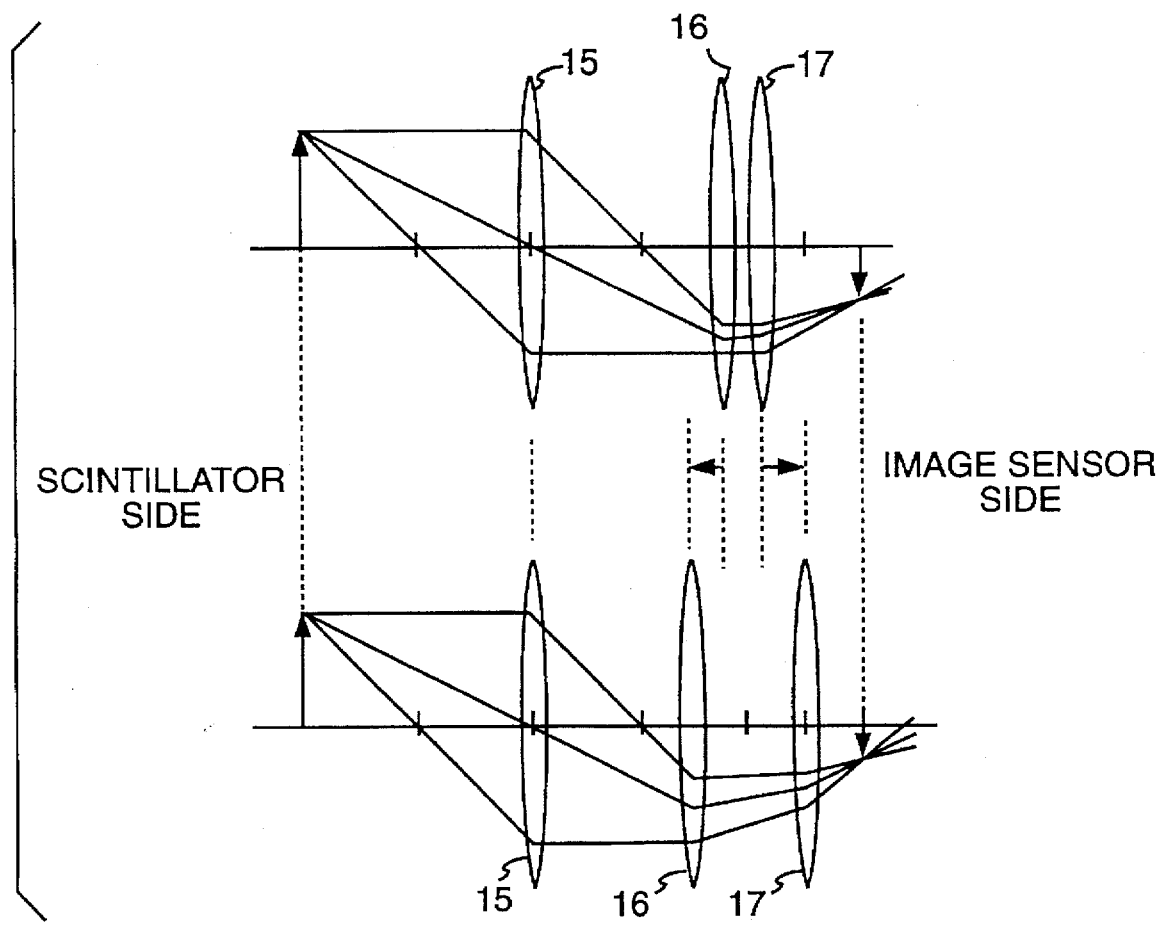
FIG. 5 illustrates the zooming function of a three-lens configuration.

In the configuration of FIG. 4, it is necessary to move one lens and the image sensor toward or away from the scintillator. In practice, however, it would be convenient if the scintillator and the image sensor were fixed to the apparatus. According to the configuration shown in FIG. 5, the image sensor is fixed, and a third movable lens is added. Lens 15 remains fixed. Of the two lenses 16, 17 that exist closer to the image sensor than to the scintillator, the lens 16 is moved further toward the scintillator and the lens 17 further toward the image sensor to permit the transferred image to be reduced further without moving the position of the image sensor. An example of a suitable three-lens system is any of the SK-H5 series manufactured by Hitachi, Ltd.

Figure 6:
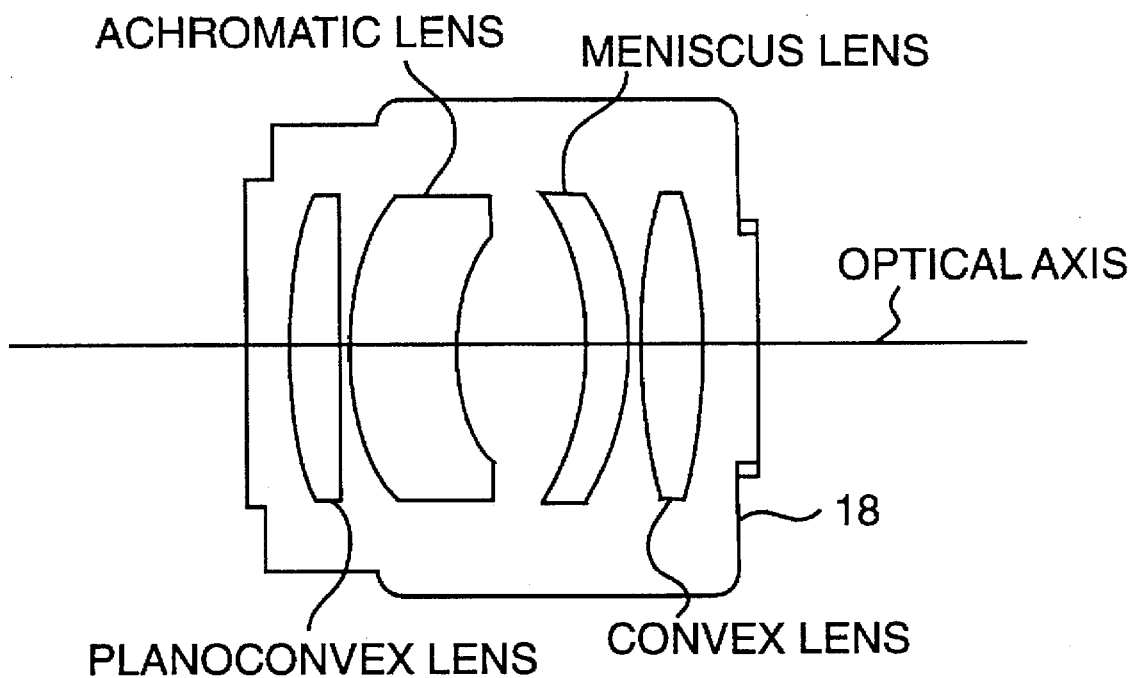
FIG. 6 shows schematically a cross-section of a single-lens reflex camera lens system.

The embodiments discussed above have used one or a combination of single convex lenses. The use of single convex lenses, however, is not always practical because the spherical aberration and chromatic aberration significantly deteriorate the resolution. For this reason, a lens system usually constituted by a combination of four to seven concave lenses and achromatic lenses in addition to the convex lenses, as shown in FIG. 6, is commercially available for use in a single-lens reflex camera. This lens system 18 itself functions as a large convex lens, and can be installed in place of the lenses 13–17 previously described.

Figure 7:
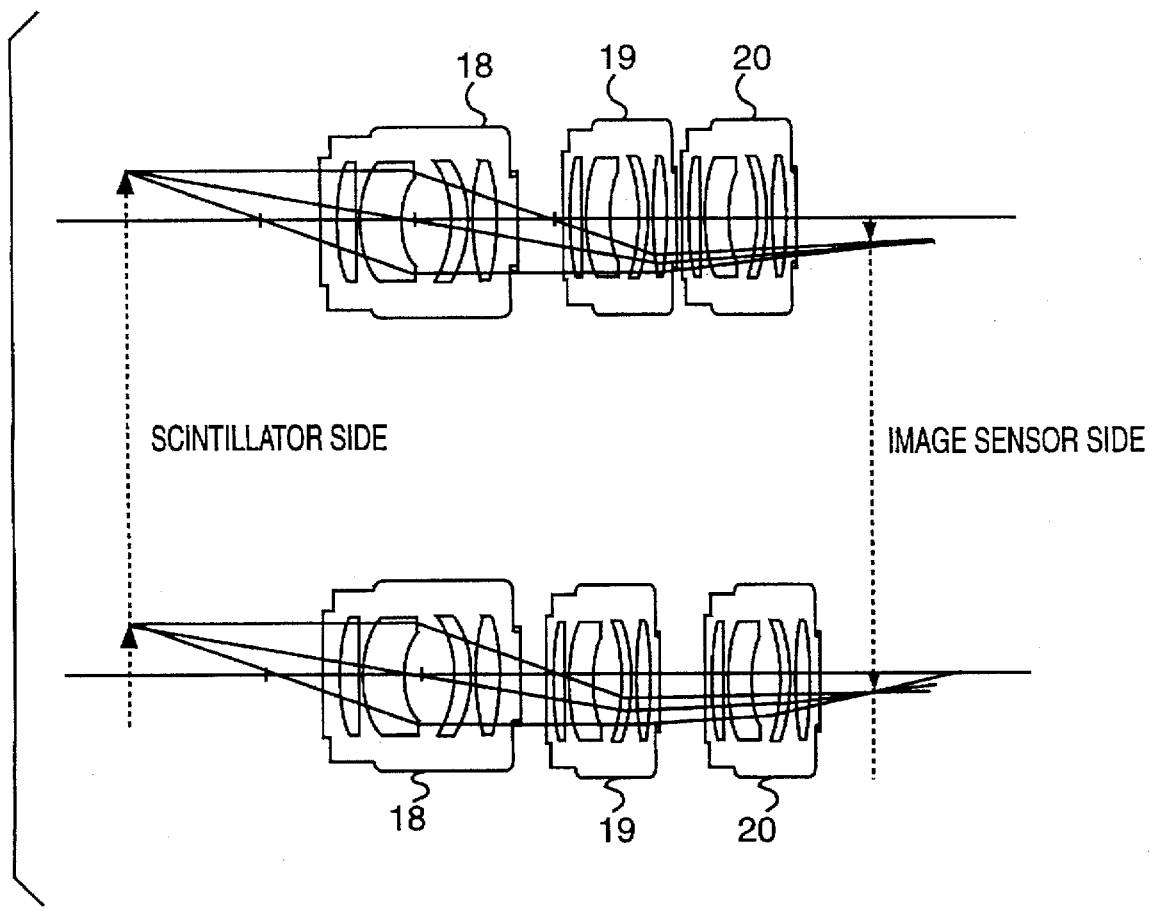
FIG. 7 depicts the zooming function of a configuration including three single-lens reflex camera lens systems.

A conventional apparatus having a configuration like that shown in the present FIG. 4, but with the lenses 13, 14 replaced with the lens system 18, has a drawback in that the positions of both the lens system 18 and the image sensor must be moved back and forth for the reduction of a transferred image. An effective way to overcome this drawback is to install the lens system 18 in place of the lenses 15–17 (FIG. 5), as shown in FIG. 7. In this configuration, by moving the lens 19 and lens 20 axially, the transferred image can be expanded or reduced without moving the position of the image sensor (i.e., without changing the distance between the light emitting surface of the scintillator and the light sensing area of the image sensor).

Figure 8:
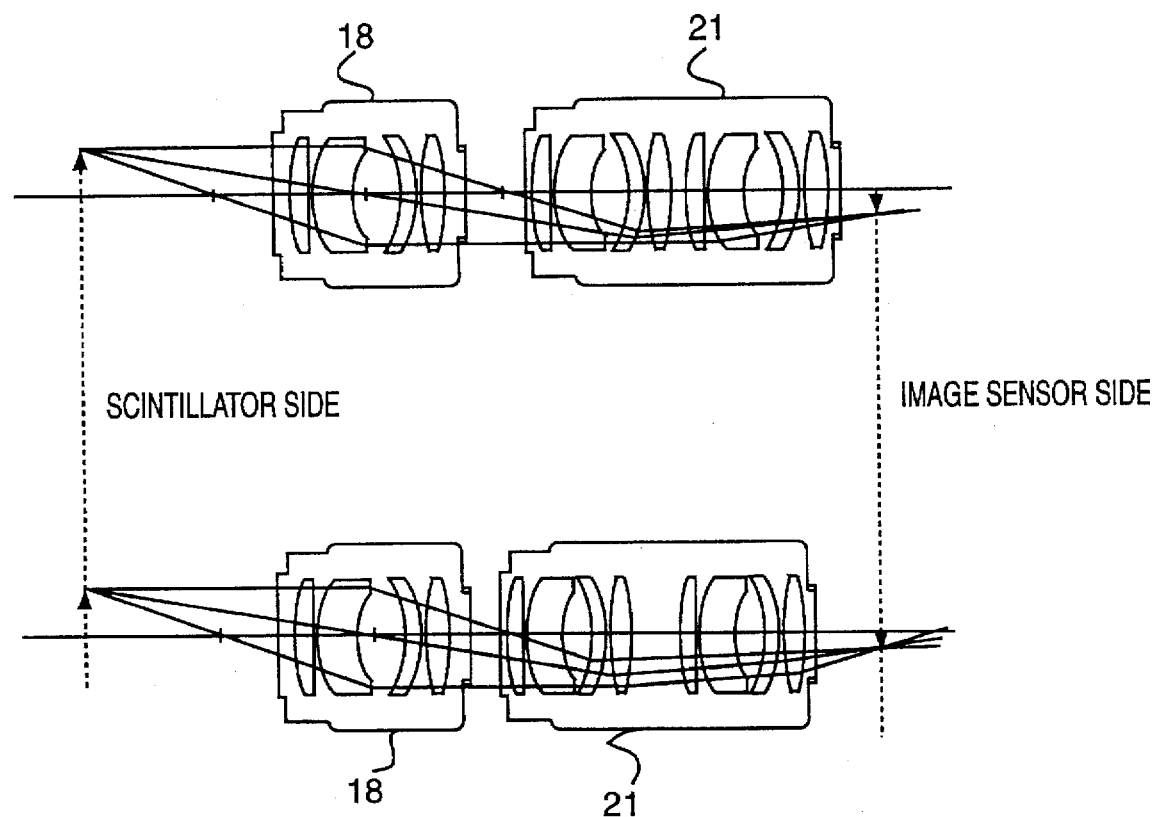
FIG. 8 illustrates the zooming function of a configuration including a single-lens reflex camera lens system and a zooming lens system.

Another embodiment of the present invention is shown in FIG. 8. In this embodiment, a commercially available zoom lens constituted by lenses 18 and 21 arranged in a single case with a variable focal distance, permits the transferred image to be enlarged or reduced without moving the position of the image sensor. Although the zoom lens 21 is installed on the image sensor side of the lens 18, it may be exchanged with the lens 18 and located on the scintillator side.

Although the embodiment shown in FIG. 1 employs an image pickup tube as the image sensor 7, the CCD is also applicable to permit the transferred image to be enlarged or reduced without having to move the position of the image sensor.

Figure 9:
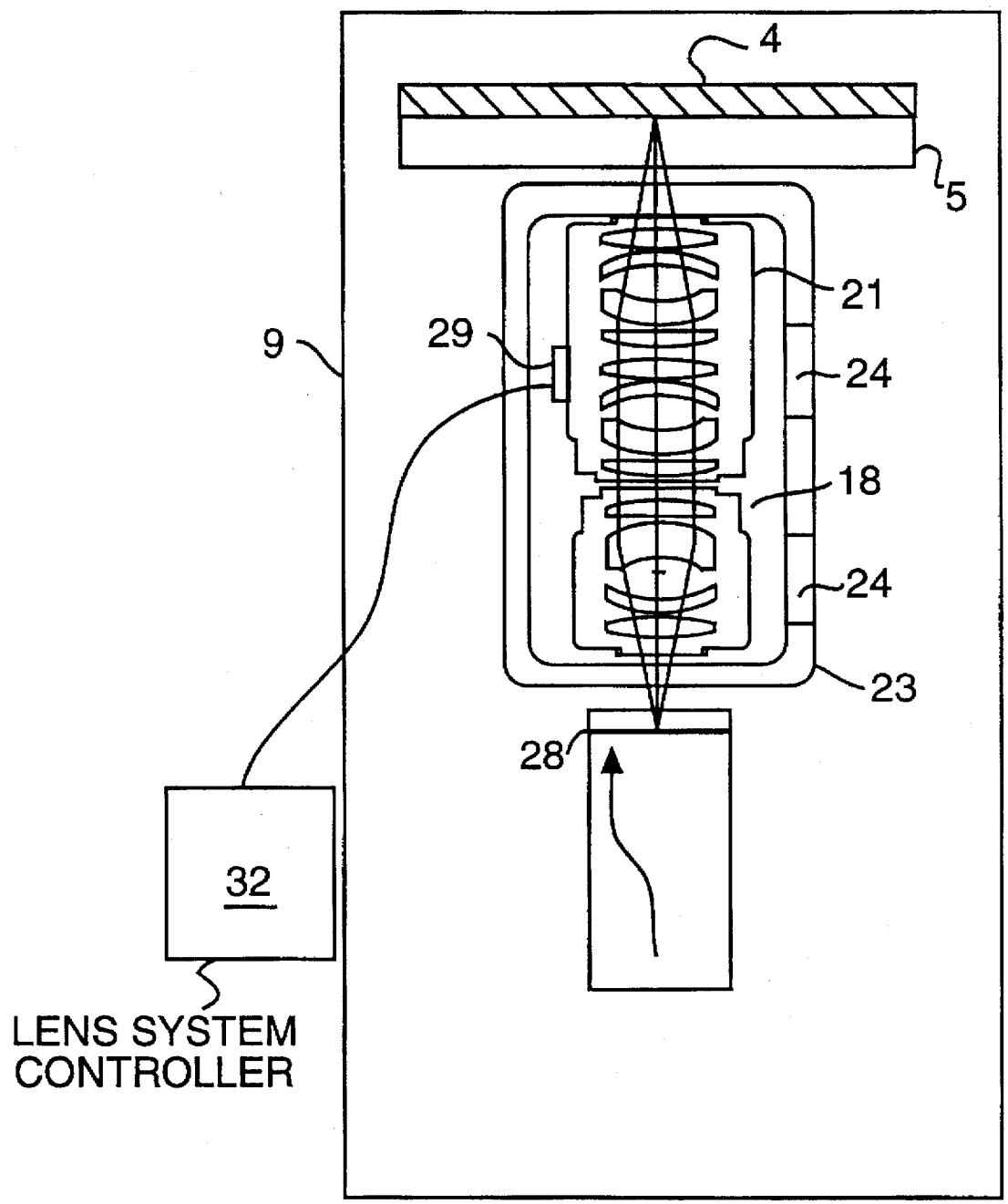
FIG. 9 illustrates details of a camera system.

FIG. 9 illustrates an enlarged view of the optical lens system 6. In the figure, the optical lens system 6 adopts the configuration shown in FIG. 8. The lens 18 and the zoom lens 21 are set in a lens fixing cylinder 23. The lens fixing cylinder 23 has a hole 24 through which a slender bar, such as a screwdriver, may be inserted to adjust the lens focal point and zoom factor. This adjustment may also be achieved by using a commercially available motor-controlled zoom lens, which allows remote adjustment of focus and zooming by driving a motor 29 from an external lens system controller 32.

Figure 10:
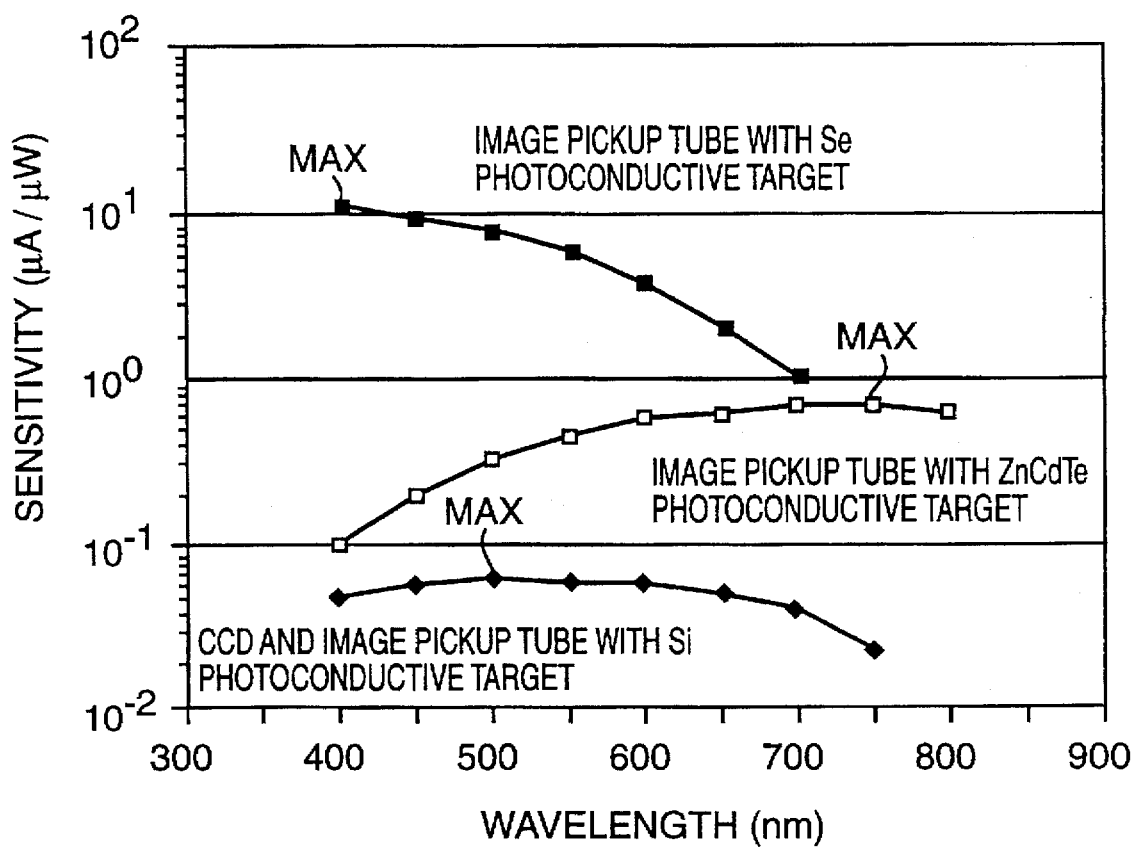
FIG. 10 plots sensitivity versus wavelength for three types of image sensor.

Among the conventional image pickup tubes suitable for use with the present invention are one that uses $Zn_{1-x}Cd_xTe$ as the photoconductive target 28 (representative trade name: Newvicon) and one using Si (representative trade name: SIT Tube—Silicon Intensifier Target Camera Tube). A charge-coupled device that uses silicon as a main component is a possible image sensor. Another image pickup tube uses amorphous selenium in the photoconductive target (representative trade name: Harpicon). The photoconductive target 28 of this image pickup tube is applied with a high voltage ranging from several hundred volts to 1000 and several hundred volts, so that electron-hole pairs generated by the incident light double in number by the avalanche effect. As a result, this image pickup tube is several tens to several hundred times more sensitive than other conventional image pickup tubes, as indicated in FIG. 10. Therefore, this image pickup tube is suitably employed when high sensitivity and high resolution is required for the camera system as a whole.

Figure 11:
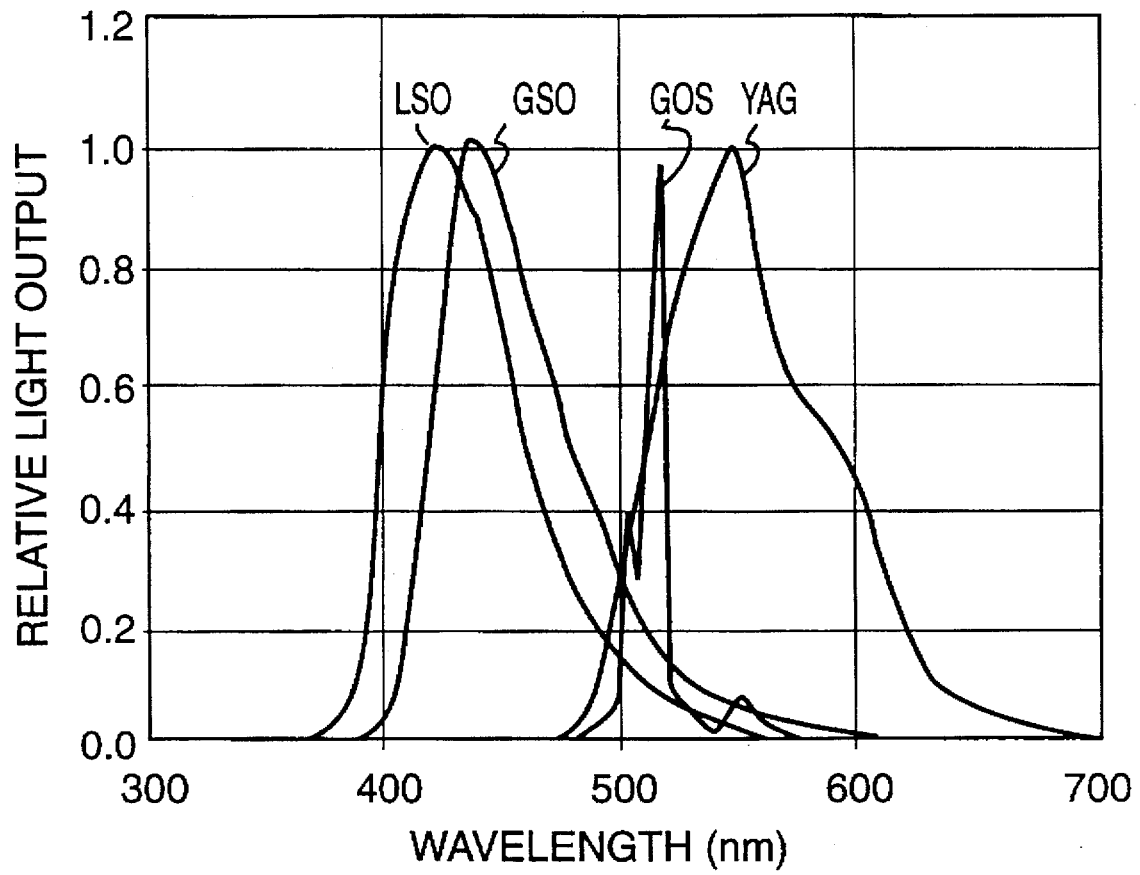
FIG. 11 plots wavelength distributions of maximum light outputs for four types of scintillator.

However, an image pickup tube employing an amorphous selenium conductive film target has a light sensitivity distribution that is shifted toward shorter wavelengths, as compared with other image sensors, and the wavelength of maximum sensitivity is 400 nm, as shown in FIG. 10. Therefore, the present embodiment employs a scintillator having a wavelength of maximum light output in a range between 350 nm and 450 nm. The wavelength of the light image produced in the scintillator 4 depends on the kind of scintillator material and, as shown in FIG. 11, has a distribution spanning several tens of nanometers, with the wavelength of peak light output at the center of the distribution.

FIG. 10 also shows the distribution of light sensitivities of conventional image sensors, with peaks located in the 500–750 nm range. The signal intensity of a photographed image is a product of the light sensing characteristic of FIG. 10 and the light output characteristic of FIG. 11. Therefore, to ensure highly sensitive photography, conventional YAG scintillators generally use, for example, $(Y_{3-x}Ce_xAl_5O_{12})$ doped with cerium, whose wavelength of peak light output is 550 nm, or GOS $(Gd_2O_2S)$ doped with praseodymium, cerium, or fluorine, with a wavelength of peak light output at 510 nm.

For the present embodiment, a new material—a metal oxyorthosilicate doped with cerium—which satisfies the requirements for high sensitivity has strong resistance against electron beam irradiation damage, and can realize high resolution because of its monocrystalline form. This new material was used in the scintillator 4 of the present embodiment. More particularly, the formula of the preferred metal oxyorthosilicate is expressed as $RE_2SiO_5$ (RE=metal elements such as Gd, Y, Lu), which is considered to include mainly gadolinium oxyorthosilicate ($Gd_2SiO_5$), yttrium oxyorthosilicate ($Y_2SiO_5$), and lutetium oxyorthosilicate ($Lu_2SiO_5$). When this scintillator is used, a precaution should be taken to use a quartz glass for the glass window 5, which exhibits almost no absorption of light around 400 nm in wavelength (near ultraviolet radiation).

Figure 12:
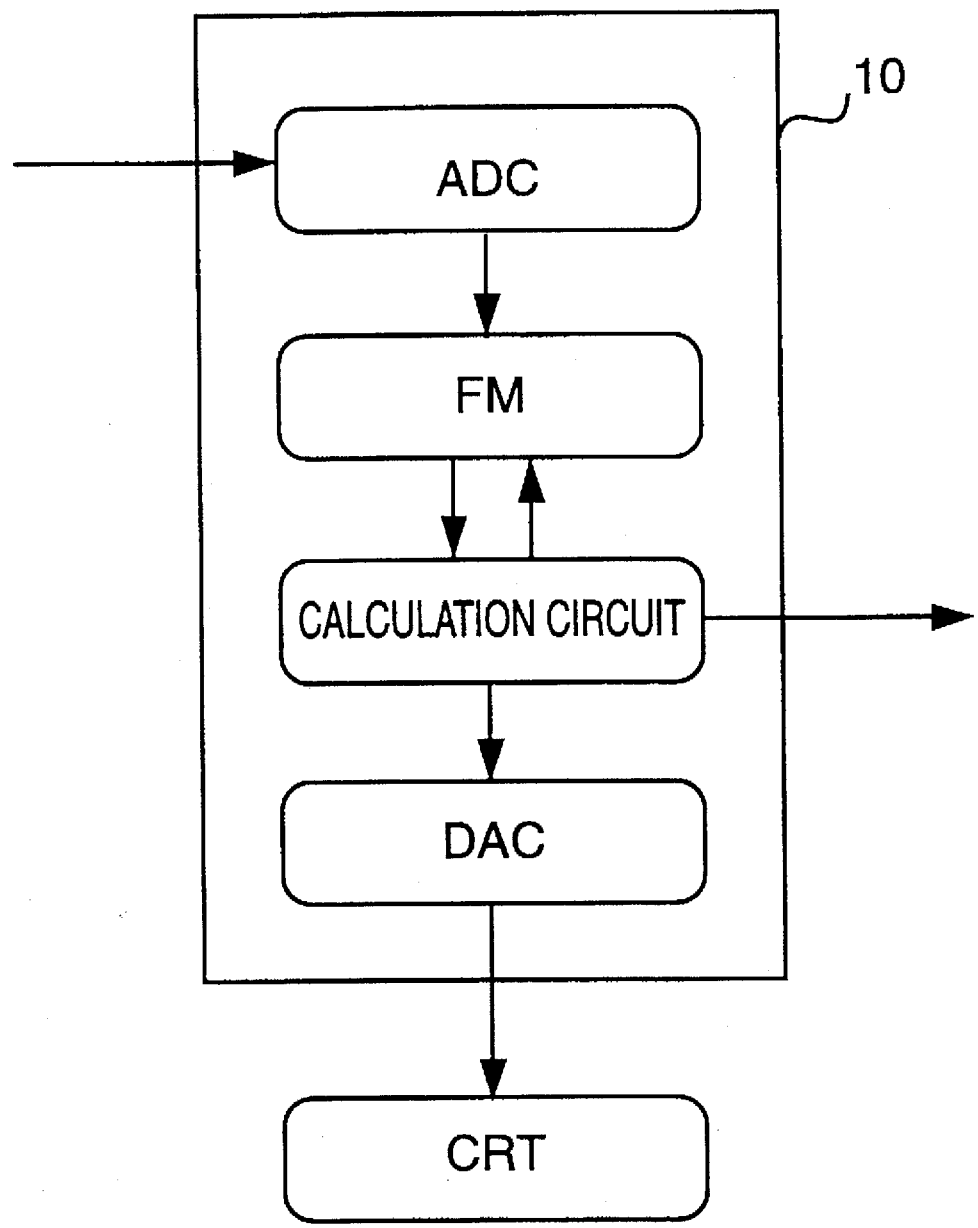
FIG. 12 is a block diagram of a configuration of an image recording and processing system.

The image recording and processing system 10 shown in FIG. 1 is described in detail with further reference to FIG. 12. The image signal output from the image sensor 7 is an analog signal, which is converted by an analog-digital converter into a digital signal for a variety of processing steps. The image information for 2000 scan lines is AD-converted into 2000 channels for each scan line, so that the image information can be handled as digital image data equivalent to 2000×2000 pixels.

Figure 13A:
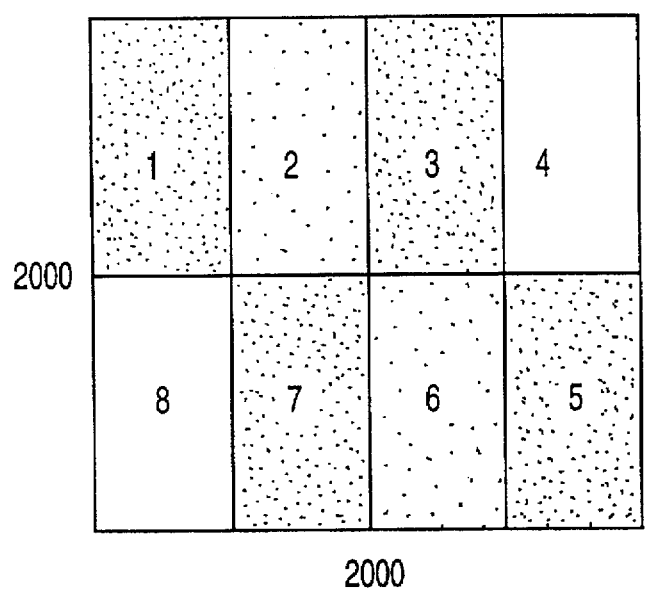
FIGS. 13(a) and 13(b) show the division and storage of large-capacity image data in a frame memory.
Figure 13B:
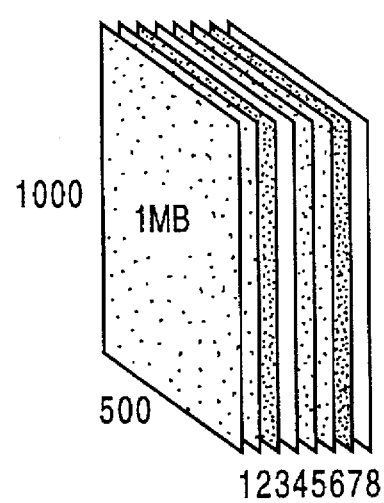

Such digital data is stored temporarily on a rewritable memory medium normally termed a frame memory (FM). For example, 2000×2000 digital image data having 1024 levels of tone (12 bits) is divided into eight regions, as shown in FIG. 13(b), which are stored on eight frame memories of one megabyte each. Similarly, when digital image data equivalent to 4000×4000 pixels are to be handled, 16 frame memories, or two frame memories of eight megabytes each, are required.

Furthermore, when image processing, such as combining two images, is to be performed, a memory medium with two or more times the ordinary capacity should be used. Such image processing normally involves exchanging data between the frame memories and the calculation circuit, reconverting the calculation result to an analog signal using a digital-analog converter (DAC) for display on a CRT or storing the digital data result in an external storage device, and printing the image.

Finally, the handdifferent optical lens system 6 that is different from FIG. 1 will be described. The angle of refraction of light passing through a lens in air depends on both the index of refraction of the glass forming the lens (ng) and the index of refraction of air (na). The refractive index of air changes greatly due to variations in atmospheric pressure and temperature. Therefore, the optical lens system 6 may lose its previously adjusted focus.

Figure 14:
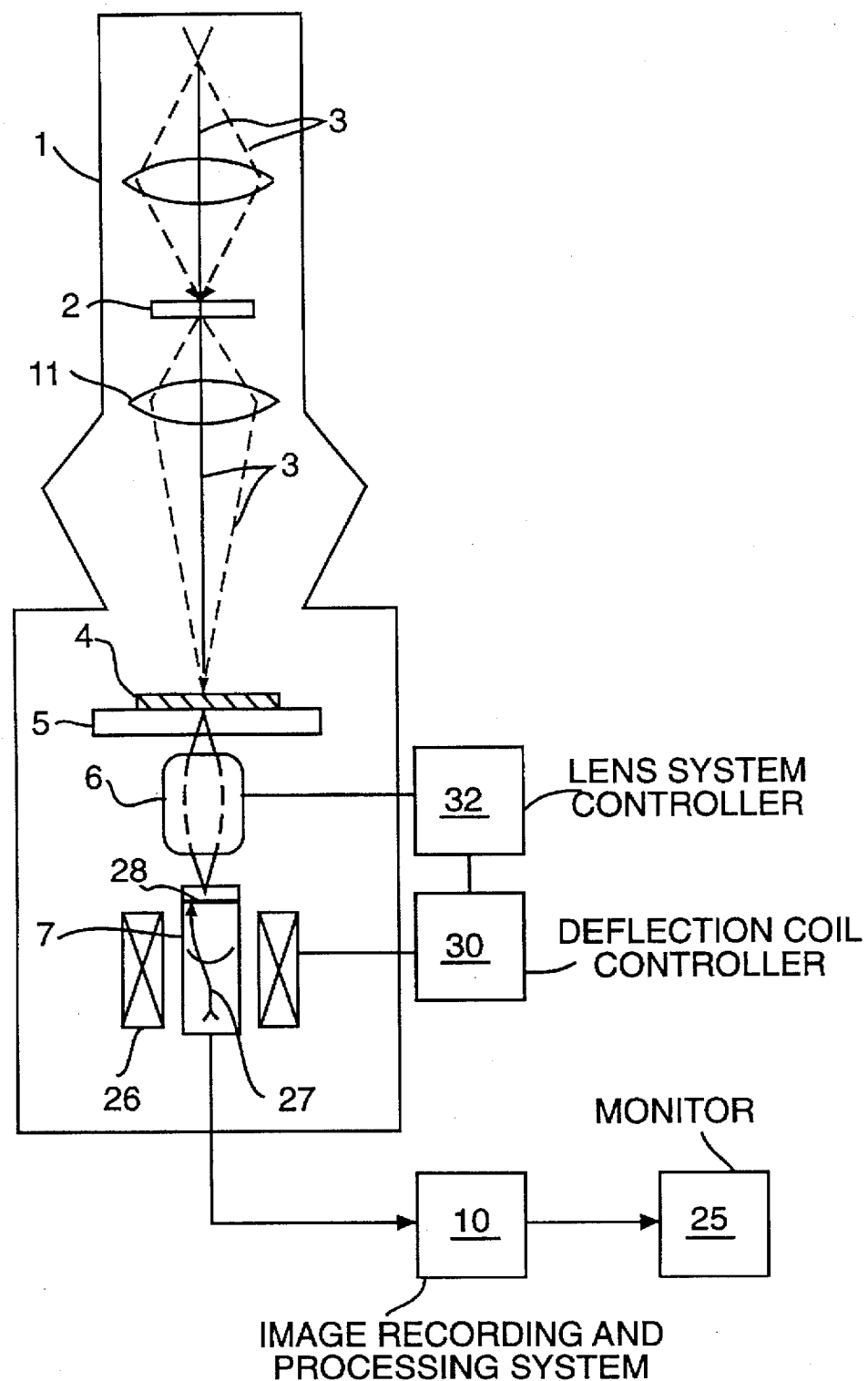
FIG. 14 illustrates an optical lens system installed in a vacuum in an electron microscope.

One method for solving this problem is to install the entire optical lens system 6 in a vacuum. FIG. 14 illustrates an example. Since the scintillator 4 is installed in the vacuum, the FIG. 14 configuration places the optical lens system 6, image sensor 7, and deflection coil 26 within the electron microscope case. This arrangement maintains the angle of refraction of the lens constant at all times, preventing a focal shift due to external factors.

Although various embodiments of the invention which enable free enlargement or reduction of the field of vision without reducing the amount of specimen information and without modifying the observation conditions of the electron microscope have been described, the person of ordinary skill will readily derive additional embodiments based upon the teachings through which the present invention has advanced the state of the art. All such modifications are properly considered within the spirit and scope of the invention.

We claim:

1. In a transmission electron microscope in which an electron beam is emitted to a specimen, transmitted or diffracted thereby, and focused to form an image of the specimen, a camera system for forming the image, comprising:

a scintillator for transforming the transmitted or diffracted electron beam into light;

a pickup tube including a photoconductive target;

a variable-magnification optical lens system for transferring the light produced by the scintillator into the pickup tube; and a deflection coil to control a scanning electron beam for detecting signals from the photoconductive target;

wherein a voltage that corresponds to magnification or reduction by the optical lens system is applied to the deflection coil for varying the scanning electron beam according to said magnification or reduction.

2. A transmission electron microscope according to claim 1, wherein the optical lens system includes at least three convex lenses in combination to provide a zooming function, wherein one of said three convex lenses is fixed, and wherein the positions of the scintillator and the pickup tube are fixed.

3. A transmission electron microscope according to claim 1, wherein the pickup tube has an amorphous selenium photoconductive target.

4. A transmission electron microscope according to claim 3, wherein the scintillator includes a metal oxyorthosilicate.

5. A transmission electron microscope according to claim 4, wherein the metal oxyorthosilicate is gadolinium oxyorthosilicate ($Gd_2SiO_5$) doped with cerium, yttrium oxyorthosilicate ($Y_2SiO_5$) doped with cerium, or lutetium oxyorthosilicate ($Lu_2SiO_5$) doped with cerium.

6. A transmission electron microscope according to claim 1, wherein the scintillator has a target size of about 900 $mm^2$, and a thickness between 10–100 μm.

7. A transmission electron microscope according to claim 1, wherein the optical lens system is no larger than about 150 mm in diameter and no longer than about 200 mm.

8. A transmission electron microscope according to claim 1, further comprising a camera body housing the deflection coil, wherein the camera body is no larger than about 150 mm in diameter and no longer than about 200 mm.

9. A transmission electron microscope according to claim 1, wherein the deflection coil deflects the scanning electron beam to make the intervals between rows scanned by the scanning electron beam.

10. A transmission electron microscope according to claim 1, wherein the scintillator has an optical output distribution in which the wavelength for the maximum light output is in a range between 350 nm and 450 nm.

11. In a transmission electron microscope in which an electron beam is emitted to a specimen, transmitted or diffracted thereby, and focused to form an image of the specimen, a camera system for forming the image, comprising:

a scintillator for transforming the transmitted or diffracted electron beam into light;

a pickup tube including a photoconductive target;

a variable-magnification optical lens system for transferring the light produced by the scintillator into the pickup tube; and a deflection coil to control a scanning electron beam for detecting signals from the photoconductive target;

wherein the optical lens system includes at least three convex lenses in combination to provide a zooming function, wherein one of said three convex lenses is fixed, and wherein the positions of the scintillator and the pickup tube are fixed.

12. A transmission electron microscope according to claim 11, wherein the scintillator has a target size of about 900 $mm^2$, and a thickness between 10–100 μm.

13. A transmission electron microscope according to claim 11, wherein the optical lens system is no larger than about 150 mm in diameter and no longer than about 200 mm.

14. A transmission electron microscope according to claim 13, further comprising a camera body housing the deflection coil, wherein the camera body is no larger than about 150 mm in diameter and no longer than about 200 mm.

15. A transmission electron microscope according to claim 9, wherein the deflection coil deflects the scanning electron beam to make the intervals between rows scanned by the scanning electron beam.

16. A transmission electron microscope according to claim 9, wherein the scintillator has an optical output distribution in which the wavelength for the maximum light output is in a range between 350 nm and 450 nm.

17. A camera system for forming an image, comprising:
a scintillator for transforming an electron beam into light;
a pickup tube including a photoconductive target;
a variable-magnification optical lens system for transferring the light produced by the scintillator into the pickup tube; and
a deflection coil to control a scanning electron beam for detecting signals from the photoconductive target;
wherein a voltage that corresponds to magnification or reduction by the optical lens system is applied to the deflection coil for making the scanning electron beam variable according to said magnification or reduction.

18. A camera system according to claim 17, wherein the optical lens system includes at least three convex lenses in combination to provide a zooming function, wherein one of said three convex lenses is fixed, and wherein the positions of the scintillator and the pickup tube are fixed.

19. A camera system according to claim 17, wherein the pickup tube has an amorphous selenium photoconductive target.

20. A camera system according to claim 19, wherein the scintillator includes a metal oxyorthosilicate.

21. A camera system according to claim 20, wherein the metal oxyorthosilicate is gadolinium oxyorthosilicate ($Gd_2SiO_5$) doped with cerium, yttrium oxyorthosilicate ($Y_2SiO_5$) doped with cerium, or lutetium oxyorthosilicate ($Lu_2SiO_5$) doped with cerium.

22. A camera system according to claim 17, wherein the scintillator has a target size of about 900 $mm^2$, and a thickness between 10–100 μm.

23. A camera system according to claim 17, wherein the optical lens system is no larger than about 150 mm in diameter and no longer than about 200 mm.

24. A camera system according to claim 17, further comprising a camera body housing the deflection coil, wherein the camera body is no larger than about 150 mm in diameter and no longer than about 200 mm.

25. A camera system for forming an image, comprising:
a scintillator for transforming an electron beam into light;
a pickup tube including a photoconductive target;
a variable-magnification optical lens system for transferring the light produced by the scintillator into the pickup tube; and
a deflection coil to control a scanning electron beam for detecting signals from the photoconductive target;
wherein the optical lens system includes at least three convex lenses in combination to provide a zooming function, wherein one of said three convex lenses is fixed, and wherein the positions of the scintillator and the pickup tube are fixed.

26. A camera system according to claim 25, wherein the scintillator has a target size of about 900 $mm^2$, and a thickness between 10–100 μm.

27. A camera system according to claim 25, wherein the optical lens system is no larger than about 150 mm in diameter and no longer than about 200 mm.

28. A camera system according to claim 27, further comprising a camera body housing the deflection coil, wherein the camera body is no larger than about 150 mm in diameter and no longer than about 200 mm.

29. A camera system according to claim 17, wherein the deflection coil deflects the scanning electron beam to make the intervals between rows scanned by the scanning electron beam.

30. A camera system according to claim 17, wherein the scintillator has an optical output distribution in which the wavelength for the maximum light output is in a range between 350 nm and 450 nm.

* * * * *